(12) United States Patent
Lal

(10) Patent No.: US 11,340,251 B2
(45) Date of Patent: May 24, 2022

(54) INERTIAL MEASUREMENT UNIT CALIBRATION STAGE, METHOD, AND APPLICATIONS

(71) Applicant: CORNELL UNIVERSITY, Ithaca, NY (US)

(72) Inventor: Amit Lal, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 783 days.

(21) Appl. No.: 15/771,515

(22) PCT Filed: Oct. 31, 2016

(86) PCT No.: PCT/US2016/059679
§ 371 (c)(1),
(2) Date: Apr. 27, 2018

(87) PCT Pub. No.: WO2017/075569
PCT Pub. Date: May 4, 2017

(65) Prior Publication Data
US 2018/0348251 A1 Dec. 6, 2018

Related U.S. Application Data

(60) Provisional application No. 62/248,017, filed on Oct. 29, 2015.

(51) Int. Cl.
*G01P 21/00* (2006.01)
*G01P 15/09* (2006.01)
(Continued)

(52) U.S. Cl.
CPC .............. *G01P 15/09* (2013.01); *G01C 19/56* (2013.01); *G01P 15/18* (2013.01); *G01P 21/00* (2013.01);
(Continued)

(58) Field of Classification Search
CPC .......... G01P 15/09; G01P 15/18; G01P 21/00; G01C 19/56; G01C 25/005; G01C 19/5738; H01L 41/0933
(Continued)

(56) References Cited

U.S. PATENT DOCUMENTS 9,075,077 B2    7/2015    Zolfagharkhani et al.
9,482,533 B2    11/2016    Matsuo
(Continued)

FOREIGN PATENT DOCUMENTS

WO      2014-172617      10/2014

OTHER PUBLICATIONS

International Search Report and Written Opinion; PCT/US2016/059679; Form PCT/ISA/210 and PCT/ISA/237; dated Feb. 15, 2017; 11 pages.
(Continued)

*Primary Examiner* — Robert R Raevis
(74) *Attorney, Agent, or Firm* — Barnes & Thornburg LLP

(57) ABSTRACT

A 6-degree of freedom (DOF) PZT actuator-based dither stage includes a 6-DOF PZT Z-cut bimorph actuator-based stage. A net motion sensor includes a 6-DOF PZT Z-cut bimorph actuator-based stage and a PZT Z-cut bimorph actuator-based sensing cantilever coupled to the stage to detect motion. Methods to detect inertial sensor fixed offset, bias, and net motion are disclosed.

19 Claims, 5 Drawing Sheets

(51) Int. Cl.
*G01P 15/18* (2013.01)
*G01C 19/56* (2012.01)
*H01L 41/09* (2006.01)
*G01C 25/00* (2006.01)

(52) U.S. Cl.
CPC ........ H01L 41/0933 (2013.01); *G01C 25/005* (2013.01)

(58) Field of Classification Search
USPC .................. 73/488–551, 1.37, 1.38, 105; 310/311–371
See application file for complete search history.

(56) References Cited

U.S. PATENT DOCUMENTS

| | | | |
|---|---|---|---|
| 9,778,039 B2 | 10/2017 | Najafi et al. | |
| 2002/0057532 A1* | 5/2002 | Kurita | G11B 5/5552 360/234.7 |
| 2006/0028098 A1* | 2/2006 | Kim | H02N 2/0095 310/328 |
| 2011/0309553 A1* | 12/2011 | Huff | B23K 26/032 264/400 |
| 2017/0133950 A1* | 5/2017 | Liu | B81B 7/0006 |
| 2018/0283946 A1* | 10/2018 | Rowlette | G01J 3/10 |
| 2020/0046320 A1* | 2/2020 | Wodnicki | A61B 8/4488 |

OTHER PUBLICATIONS

Aktakka, E.E., et al.; A 6-DOF Piezoelectric Micro Vibratory Stage Based on Multi-Axis Distributed-Electrode Excitation of PZT/SI Unimorph T-Beams; Center for Wireless Integrated MicroSensing and Systems (WIMS2), University of Michigan, Ann Arbor, MI, USA; Transducers 2013, Barcelona, Spain, Jun. 16-20, 2013; © 2013 IEEE; pp. 1583-1586.

* cited by examiner

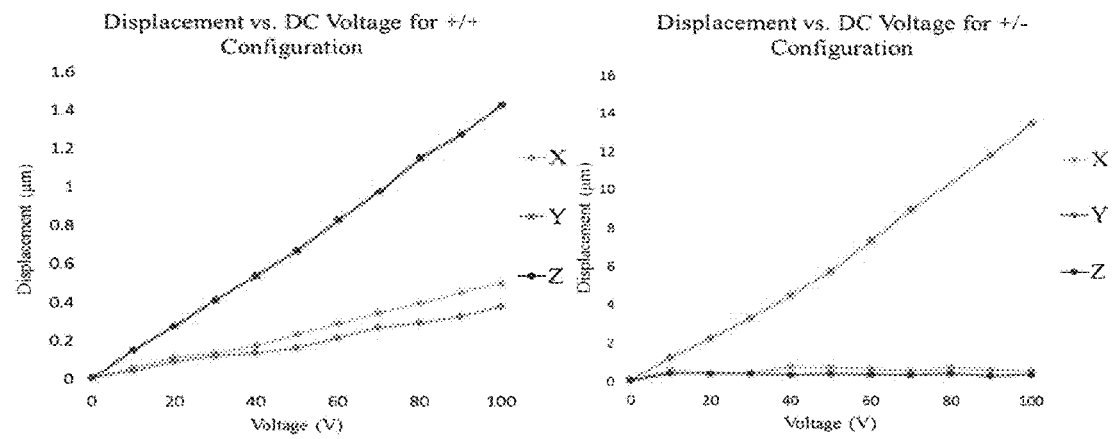
FIG. 5
FIG. 6 (a)    FIG. 6 (b)    FIG. 6 (c)
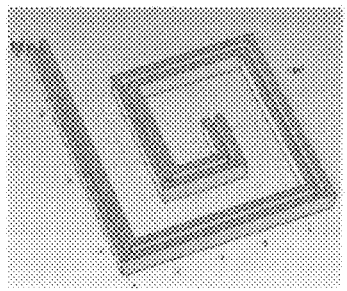 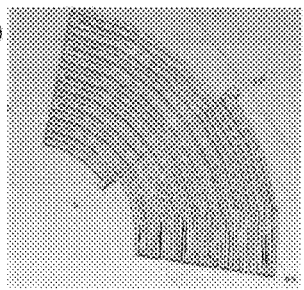 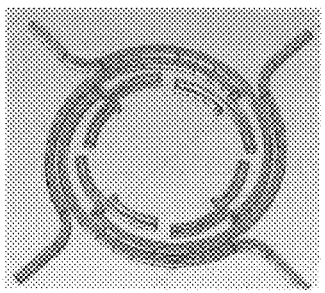
FIG. 7 (a)    FIG. 7 (b)    FIG. 7 (c)
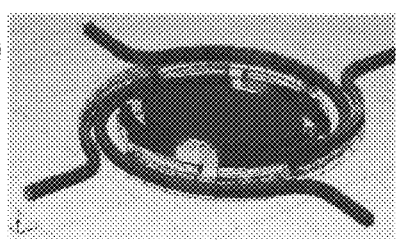 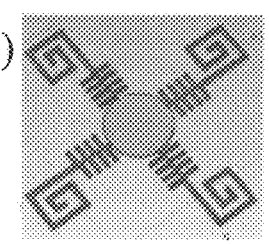 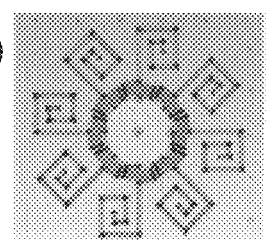

INERTIAL MEASUREMENT UNIT CALIBRATION STAGE, METHOD, AND APPLICATIONS

RELATED APPLICATION DATA

This application is a U.S. National Phase filing of International Application No. PCT/US2016/059679, filed Oct. 31, 2016, which itself claims priority to U.S. Provisional Application No. 62/248,017 filed Oct. 29, 2015, the subject matter of each of which is herein incorporated by reference in its entirety. The subject matter of commonly owned US 2016/0072041 is incorporated herein by reference in its entirety to the fullest extent allowed by applicable laws and Rules.

GOVERNMENT FUNDING

This invention was made with government support under Grant Number W31P4Q-12-1-0003 awarded by the U.S. Army-DOD. The government has certain rights in the invention.

BACKGROUND

Aspects and embodiments of the invention are generally directed to a piezoelectric (PZT) actuator-based dither stage having six degrees of freedom (DoF) that can advantageously be used to calibrate inertial sensors such as accelerometers and gyroscopes and inertial measurement units (IMUS) containing three accelerometers and three gyroscopes, as known in the art, methods for measuring sensor scale factor and bias voltage, and net motion, with extremely high accuracy, and applications thereof.

A comprehensive discussion about 3-DoF PZT bimorph actuator components and dither stages can be found in US 2016/0072041. This publication disclosed, among other things, monolithic piezoelectric actuators, a method for making a monolithic piezoelectric actuator, and a stage comprising a PZT base, a plurality of PZT actuators disposed on the base, a movable platform disposed on the base, and a plurality of deformable connectors coupled to the PZT actuators and the movable platform, wherein the stage motion is electrically controllable (i.e., can be dithered) in three dimension (±x, ±y, rotation$_x$, rotation$_y$) limited to 'in-plane' (x-y plane) motion.

Inertial sensors (i.e., one or more accelerometers and/or gyroscopes) can be used to measure the motion of an object to which they are attached. An inertial sensor, however, cannot fully determine the position of the object due to errors in the output voltage. Two known errors associated with an inertial sensor are variations in the scale factor and the bias. Scale factor is the value that connects the applied rate to the output voltage with units of volts per applied rate. The bias is a non-zero voltage output even when no motion is applied to the sensor. A challenge is to fully know the scale factor and bias to high levels of accuracy so that the actual position of the object can be determined by processing the data from inertial sensor(s).

Usually when a chip incorporates three accelerometers and three gyroscopes it can be used in the capacity of a complete inertial measurement unit, or IMU. With the degree of integration implemented in modern MEMS IMU fabrication technologies, complete IMU chips can be incorporated within a few mm$^3$ volume packages. Examples of IMU chips include: Invensense ICM 20608-G (https://www-.invensense.com/products/motion-tracking/6-axis/icm-20608-2/), or Maxim Max21100 6-axis IMU (https://www-.maximintegrated.com/en/products/analog/sensors-and-sensor-interface/MAX21100.html).

Another problem that inertial sensors suffer from is the presence of cross-axis sensitivities across sensors. For example, when a rotation is applied to an IMU chip, the motion not only generates an output voltage from the intended sensor, but also small amounts of signals emanating from the other five sensors of an IMU.

Another of the challenges with inertial calibration is to know when an actual motion has occurred, since the sensors have a DC bias voltage even when there is no motion.

In applications with stringent limits on offset errors, more expensive sensors with very low residual offset errors must generally be used, but those sensors are often relatively large, expensive, power hungry, and heavy.

In view of the aforementioned shortcomings and problems associated with inertial sensors and chip-based IMUs, the inventors have recognized the advantages and benefits to be realized by addressing these shortcomings and problems, advantageously with solutions that can be and are realized by the embodied invention directed to a 6-DoF PZT dither stage, motion detection and inertial sensor and IMU calibration methods utilizing the embodied 6-DoF PZT dither stage, and applications thereof.

Definitions as Used Herein

The term 'about' means the amount of the specified quantity plus/minus a fractional amount (e.g., ±10%, ±9%, ±8%, ±7%, ±6%, ±5%, ±4%, ±3%, ±2%, ±1%, etc.) thereof that a person skilled in the art would recognize as typical and reasonable for that particular quantity or measurement.

The term 'substantially' means as close to or similar to the specified term being modified as a person skilled in the art would recognize as typical and reasonable; for e.g., within typical manufacturing and/or assembly tolerances, as opposed to being intentionally different by design and implementation or.

SUMMARY

An aspect of the invention is a 6-DoF stage that can apply dither motion in x, y, and z, and also in rotation around the x, y, z axis. The dither motion can be used to apply a motion, linear or rotational, to an inertial sensor(s) or IMU(s) placed on the stage. The sensor can be one or more accelerometers and/or more gyroscopes. One can place chips that have one or more sensors on the stage. By dithering, a rate is applied to the stage and the sensor(s). The output of the attached sensor(s) can be compared to the applied rate to extract the scale factor and the bias from the sensor(s). In order for the sensor to be more accurate, the stage motion has to be known well, to a higher degree of accuracy than is possible with the inertial sensor being used by itself. The stage motion can be calibrated accurately using integrated optical metrology of the stage motion as known in the art (See. e.g., US20140130570).

An aspect of the invention is a dither stage. In an embodiment, the dither stage includes a PZT bimorph actuator-based dither stage having at least six degrees of freedom, including a platform having opposing top and bottom surfaces, further comprising a PZT bimorph actuator having a Z-cut groove that enables both in-plane and out-of-plane motion along three translational axes and about three rotational axes. According to various exemplary, non-limiting embodiments, the piezoelectric actuator may include the following additional features, limitations, and/or characteristics, alone or in various combinations as a person skilled in the art would understand:

wherein the PZT bimorph actuator has a square coil configuration;

comprising at least four square coil configurations;

wherein the PZT bimorph actuator has a curve meander configuration;

wherein the PZT bimorph actuator has a curve spring configuration.

An aspect of the invention is a net motion sensor. In an embodiment, the net motion sensor includes a PZT bimorph actuator-based dither stage having at least six degrees of freedom, including a platform having opposing top and bottom surfaces, further comprising a PZT bimorph actuator having a Z-cut groove that enables both in-plane and out-of-plane motion along three translational axes and about three rotational axes, and an array of integrated lateral PZT Z-cut bimorph sensors coupled to the dither stage, wherein the array of integrated lateral PZT Z-cut bimorph sensors are sensitive to angular or linear acceleration of the dither stage and which have at any given time a zero output if no angular or linear acceleration is being applied to them.

An aspect of the invention is a method for determining differential signals and/or net bias changes of an inertial sensor. In an embodiment, the method includes the steps of providing a PZT bimorph actuator-based dither stage having at least six degrees of freedom, including a platform having opposing top and bottom surfaces, further comprising a PZT bimorph actuator having a Z-cut groove that enables both in-plane and out-of-plane motion along three translational axes and about three rotational axes; disposing at least one inertial sensor on the platform; and dithering the dither stage to extract an output signal. According to various exemplary, non-limiting embodiments, the method may include the following additional steps, features, limitations, and/or characteristics, alone or in various combinations as a person skilled in the art would understand:

further comprising disposing the at least one inertial sensor on the top surface and at least one other inertial sensor on the bottom surface, wherein the at least one inertial sensor on the top surface has a sensitive axis facing in an opposite direction to a corresponding sensitive axis of the at least one other inertial sensor disposed on the bottom surface;

further comprising disposing the at least one inertial sensor on the top surface and at least one other inertial sensor on the top surface adjacently side-by-side such wherein the at least one inertial sensor on the top surface has a sensitive axis facing in an opposite direction to a corresponding sensitive axis of the at least one other inertial sensor;

wherein the inertial sensor is an IMU;

wherein the dithering step further comprises dithering at a constant voltage and then sweeping in frequency to achieve different rates;

wherein the dithering step further comprises using an external magnetic coil to drive a permanent magnet coupled to the moving stage.

An aspect of the invention is a method for determining a net motion of an IMU. In an embodiment, the method includes the steps of providing a PZT actuator-based dither stage having at least six degrees of freedom, including a platform having opposing top and bottom surfaces, further comprising a PZT bimorph actuator having a Z-cut groove that enables both in-plane and out-of-plane motion along three translational axes and about three rotational axes, and an array of integrated lateral PZT bimorphs coupled to the dither stage, wherein the array of integrated lateral PZT bimorphs are sensitive to angular or linear acceleration of the dither stage and which have at any given time a zero output if no angular or linear acceleration is being applied to them; providing an inertial sensor disposed on the platform; and determining an output signal from the array of integrated lateral PZT bimorphs.

It should be appreciated that all combinations of the foregoing steps, features, limitations, and/or characteristics, and additional aspects and embodiments discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE FIGURES

FIG. 5 graphically shows experimental results for bimorph tip displacement in X, Y & Z directions for the configuration 1 and 2 drive schemes of FIG. 3.

FIG. 6 schematically shows different geometry z-groove bimorph actuators: (a) square coil actuator; (b) curve meander actuator; (c) curve actuator with curve spring, according to illustrative aspects of the invention.

FIG. 7 schematically shows different geometry tilt stage components for a 6-DOF PZT stage: (a) tilt stage built from curve actuator and curve spring; (b) tilt stage built from four square coils; (c) tilt stage built from 8 square coils, according to illustrative aspects of the invention.

DETAILED DESCRIPTION OF NON-LIMITING, EXEMPLARY EMBODIMENTS

Figure 1:
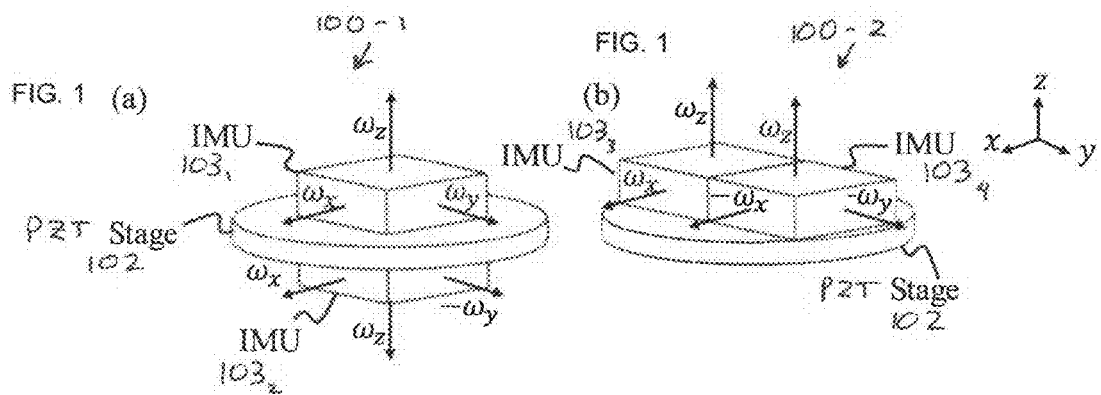
FIG. 1(a) illustrates how two (or more) IMU chips mounted on the top and bottom, respectively, of a PZT stage can be used to generate a differential output useful for mitigating fixed-offset or net biases in the IMUs.
FIG. 1(b) illustrates how two (or more) IMU chips mounted side-by-side on a PZT stage can be used to generate a differential output useful for mitigating fixed-offset or net biases in the IMUs, according to illustrative embodiments of the invention.

An illustrative embodiment of the invention is a method to determine the earth's rotation rate. Generally speaking, two (or more) chip-scale gyroscopes (gyros) with their sensitive axes oriented opposite to each other can be positioned on a dither stage which, when dithered, enables extraction of scale factor and bias of each gyroscope chip, eliminating that source of noise in extracting the earth rotation rate. This is illustrated in FIGS. 1(a) and 1(b) using two chip-scale IMUs.

Referring to FIG. 1(a) set-up 100-1, two IMU chips $103_1$ and $103_2$ can be placed on opposite sides of a PZT actuator-based dither stage 102. By placing the first IMU z-axis ($\omega_z$) facing up and the second IMU z-axis ($\omega_z$) facing down, the output of each gyroscope $103_1$, $103_2$ will be opposite in polarity as they are exposed to motion with different directions. Referring to FIG. 1(b) set-up 100-2, placing two gyroscopes $103_3$, $103_4$ next to each other such that the second gyroscope is rotated by 180 degrees, a differential output will be generated. IMU chips can be connected to outside electronics via wirebonds.

Figure 2:
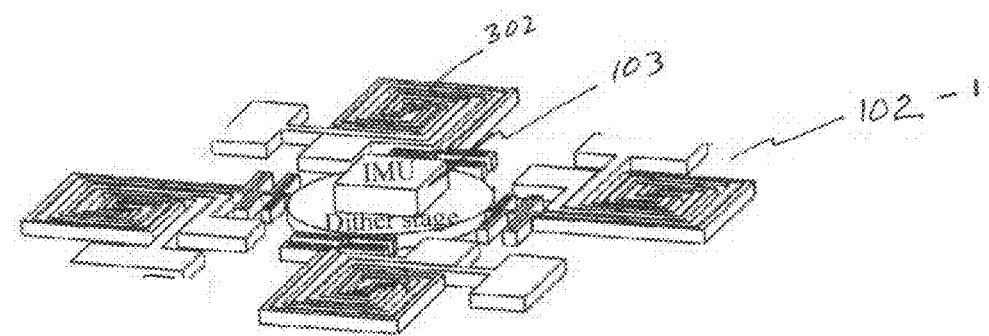
FIG. 2 schematically shows a 6-DoF PZT actuator-based dither stage having a square coil Zcut bimorph actuator configuration, according to an illustrative embodiment of the invention.
Figure 3:
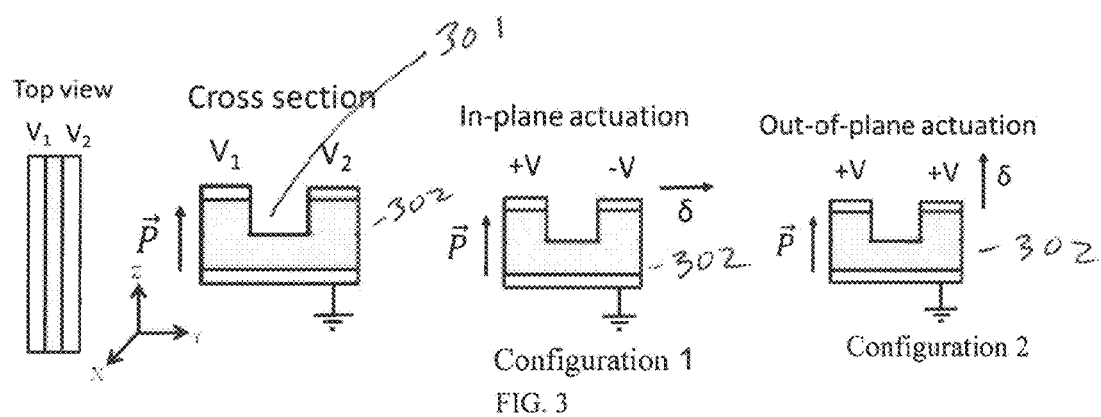
FIG. 3 schematically shows a top view ((left) and three cross sectional views of a 3-DOF PZT bimorph with drive configurations for in-plane and out-of-plane motion, according to illustrative aspects of the invention.

Advantageously, the PZT actuator-based dither stage 102 has six degrees of freedom (DoF) enabled by PZT bimorph actuators 302 as illustrated in FIGS. 3 and 4(a-c). Angular dither provides differential values for the integrated accelerometers. FIG. 2 schematically illustrates a 6-DoF PZT actuator-based dither stage 102-1 having a square coil Z-cut bimorph actuator configuration as illustrated in FIG. 6(a), discussed further below.

Referring again to FIG. 1, the differential measurement also enables the reduction of net bias changes. The output from two gyroscopes can be written as:

$$V_{(g,x1)} = S_{x1}\Omega_{x1} + B_{x1}$$

$$V_{(g,x2)} = S_{x2}\Omega_{x2} + B_{x2}$$

where $V_{(g,x1)}$ and $V_{(g,x2)}$ are x-axis gyroscope outputs from gyroscope 1 and 2, respectively, S is the scale factor, $\Omega$ is the rotation rate, and B is the bias. The bias itself and correlation of bias fluctuation $B_{x1}$ and $B_{x2}$ can be identified. The output with bias reduction can be calculated by weighted averaging, Kalman filter, or other techniques.

Figures 4A, 4B, 4C:
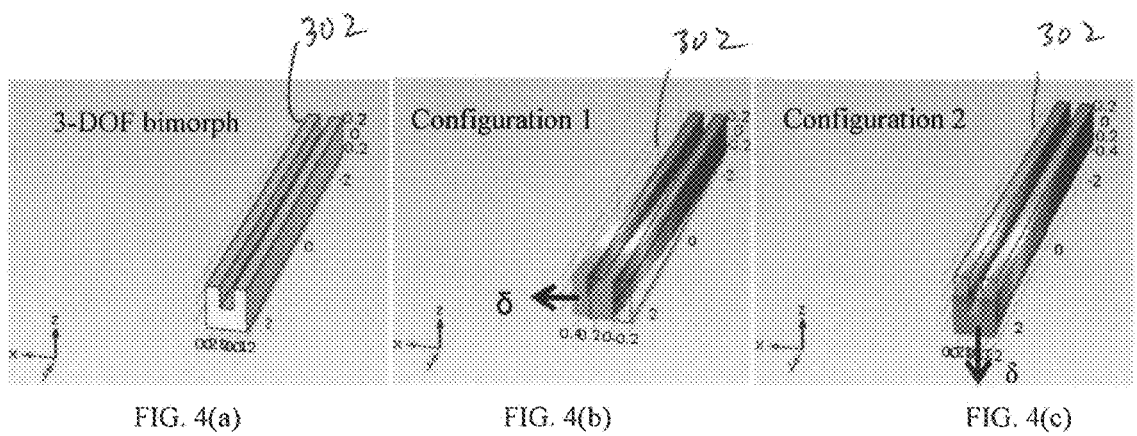
FIG. 4 is a COMSOL 3-D simulation showing: (a) 3-DOF bimorph actuator; (b) In-plane actuation for configuration 1 drive scheme; (c) out-of-plane actuation configuration 2 drive scheme, according to illustrative aspects of the invention.

The ability to dither the PZT stage in 6-DoF is enabled by cutting a Z-cut groove 301 in the PZT bimorph beam as illustrated in FIGS. 3 and 4(a). The Z-cut groove allows the beam 302 to swing back and forth and up and down as illustrated in FIGS. 4(b) and 4(c), respectively. This motion can be used to generate rotations and accelerations in all 6 DoF.

In-plane (X,Y) and out-of-plane (Z) actuation is achieved by having the same polarity voltages (configuration 1) and opposite polarity voltages (configuration 1), respectively, on the top electrode as shown in FIG. 2 with the displacement plot shown in FIG. 5, which shows displacement vs. DC voltage for +/+ configuration (1) on the left and displacement vs. DC voltage for +/− configuration (2) on the right.

Combinations of z-groove bimorph actuators can be optimized for different properties such as z-axis displacement, cross coupling, and out-of-plane spring constant. Examples of different combinations are shown in FIGS. 6a, 6b, 6c.

FIG. 6a illustrates a square coil actuator; FIG. 6b illustrates a curve meander; and FIG. 6c illustrates a curve actuator with curve spring.

The embodied 6-DoF PZT actuator-based dither stage can be designed with combinations of z-groove bimorph actuators as shown in FIGS. 7a, 7b, 7c. Non-limiting examples of different designs are shown. A 6 DoF stage built from curve actuators with z-groove bimorphs is shown in FIG. 7a. This stage is maximizing z-angular dither mode. A 6 DoF stage built from 4 square coil bimorph actuators is shown in FIG. 7b. This stage is minimizing cross coupling by trading off dither amplitude. A 6 DoF stage built from 8 square coils is shown in FIG. 7c. This stage is minimizing cross coupling, by implementing precise and independent voltage control on 16 electrodes.

Figure 8:
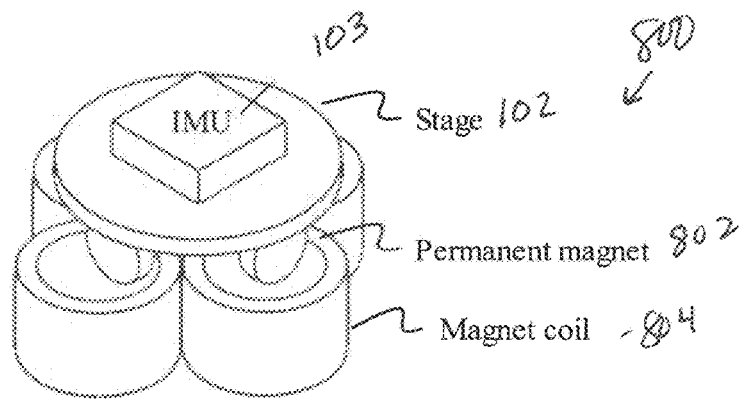
FIG. 8 schematically shows four permanent magnets mounted under the stage. Four coils are placed in the vicinity of the magnets to induce out-of-plane actuation by magnetic force.

FIG. 8 illustrates a 6 DoF stage embodiment 800 in which four permanent magnets 802 were mounted under the dither stage 102. Coils 804 were mounted under the magnets and can be controlled separately. Each magnet generates torque and/or force to actuate the stage.

Figure 9:
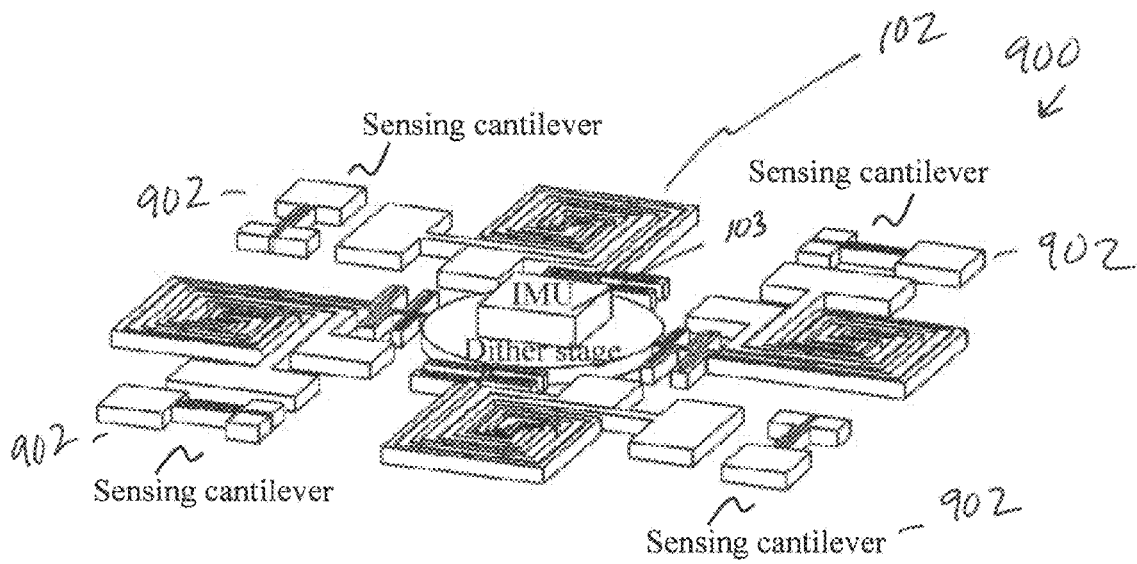
FIG. 9 schematically shows an IMU on a 6-DOF PZT dither stage integrated with sensing cantilevers to detect motion, according to an embodiment of the invention.

FIG. 9 schematically illustrates an IMU motion sensor 900 and associated method for determining a net motion of an IMU and demonstrates integrated PZT bimorphs that give a secondary signal for motion which deviates from zero motion. This additional information can be used to generate more accurate models of very low rate signals from the gyroscope. A DoF dither stage with square coil, Z-cut bimorph actuators 102-1 (FIG. 2) incorporates an array of PZT bimorph sensing cantilevers 902. For active dithering approaches to measure the signal on a set of inertial sensors it is highly advantageous to determine if the inertial sensor is being effected by net motion. If there is no stimulus being applied to the sensor from the external world, then the output of the sensor should be exactly zero. While the sensor output from the sensor might be producing a non-zero output, it can be as a product of actual applied rates from the outside world or as result of a bias from the sensor. Hence, to measure biases, it is important to know if any external motion is being applied to the sensor system, and this mechanism should not have any bias of its own. Sensor 900 includes an array of integrated lateral PZT bimorphs 902 that at given time have a zero output if no angular or linear acceleration is being applied to them. The PZT bimorph serves as a rotation indicator with zero bias, but poor sensitivity, aging, and temperature sensitivity. However, a nonzero output from the bimorph can be used to indicate that there is some rotation or motion that has been applied. With this sensor, when it has zero output, we can say that the output of the actual gyro is a result of the gyro bias alone, and hence know the bias. When the bimorph sensor produces a non-zero value, we know that the gyro signal is now not only the bias but also the sum of the voltages due to the bias and the signal.

The PZT bimorph sensor also consumes zero power, and hence can be used as a way to turn off the self-calibrating sensor when no motion is present to reduce power and energy budgets of the complete self-calibrating system. In the case of calibrated sensor being a gyro, the rotation of the earth is always producing an external signal, which is usually very small compared to signals of interest. Hence, the lateral bimorph is still useful when actual initial motion is applied, and the configuration that generates a result of net rotation and not just translation can also be useful to distinguish between whether the gyroscope or accelerometers need to be calibrated.

An embodiment of the invention is a method for determining differential signals and/or net bias changes of an IMU. Piezoelectric materials such as PZT are ferroelectric materials with nonlinear dielectric response. When an electric field is applied on a PZT ceramic, the electric field induces motion of the atoms to create a net electric polarization, and net motion. The resulting electrical polarization is linear for small applied electric fields but can saturate at high electric fields because of the saturation of the number and strength of the dipoles that are created by the applied field. The hysteresis of the polarization occurs in the sense the polarization does not go to zero when the applied field is zero due to permanent position change of the atoms.

Figures 10A, 10B:
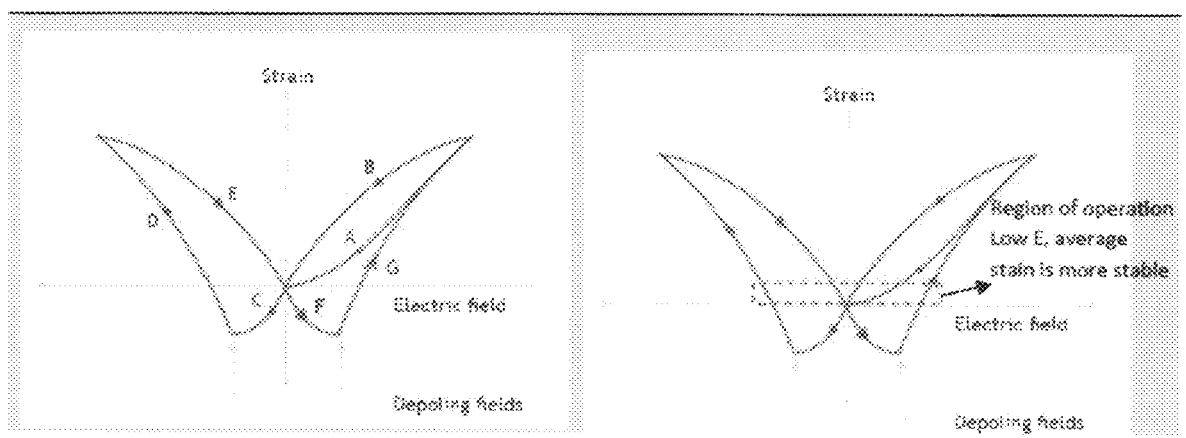
FIG. 10a shows a hysteresis loop for PZT in a typical drive sequence A-G to achieve variable actuation velocities.
FIG. 10b shows a hysteresis loop for a fixed voltage, variable frequency drive mode that provides operation within a linear region, according to an embodiment of the invention.

FIG. 10a shows the resulting in hysteresis in the generated strain versus applied field showing the nonlinearity and memory effect in piezoelectric materials. Furthermore, moving the dipoles changes the dielectric D-E relationship, resulting in field induced aging of the material.

To achieve different dither angular velocities, one can apply different voltages at a constant frequency, or drive at a constant voltage and variable frequency as the resulting dither rate can be written as $\theta' = V\omega \operatorname{Sin}(\omega t)$. If one drives the stage at a constant frequency, then different voltages need to be applied, resulting different hysteresis residuals around the hysteresis loop. Due to hysteresis and aging issues in PZT, one can get different aging related velocities due to creep and drift errors in displacements, depending on the drive history of the materials. Closed loop amplitude control of applied electric field on the PZT is often employed in achieving long term stable motion generation. However, such a system is often limited by the resolution of the feedback control system. It is desirable to minimize the resulting lack of precision in dither motion due to hysteresis, to reduce the complexity and increase the precision of the closed loop controllers. In order to achieve higher precision dither stage, we drive the PZT bimorphs at a fixed voltage, with equal positive and negative voltage swings leading to a constant swing of electric field across the PZT material, by controlling the voltages such that we operate in the region highlighted in FIG. 10b. The constant swing of the electric field leads to the same hysteresis curve path which in turn results in a reliable positioning of the actuator on the ceramic strain and polarization operating points. To achieve different dithering velocities, we change the frequency of drive, rather than the amplitude of the drive to get different dither rates applied to the stage and the attached inertial sensors on the stage. Driving the actuator at a constant voltage has the added benefit of simplicity of the linear amplifier needed to drive the PZT actuators, eliminating the need for a variable gain high voltage amplifiers.

We used a low resolution, high speed optical profile sensor to measure the position of the optical diffraction pattern. A laser, locked to an alkali metal absorption line, is incident onto a diffraction grating mounted on the PZT stage. The resulting diffraction pattern is imaged on an image sensor. The motion of the diffraction pattern can be determined with nanometer level precision, using sub-pixel interpolation techniques. We have demonstrated <10 ppm aging of the displacement measurement accuracy. Such optical profile sensors are made to usually characterize optical beam uniformity. Limited number of pixels, such as 10×10 or 50×50 photodiode pixels, are used to extract the beam profile. A commercial example of this sensor is the Hamamatsu S1932 sensors with 256×256 pixels sampled at 8 or 10 bit resolution, with the ability to extract frames at 3200 frames per second with 8 bit resolution. A consequence of the limited number of pixels is the ability to read out the pixels at very fast rates of kilo-to mega frames per second. This fast rate can be the same as the dither frequencies of a few kilo-hertz. Hence, the changing position of the optical diffraction pattern can be captured in real time by an optical imager that samples much above the dither frequency, allowing real time DSP to extract motion dynamics. The motion dynamics then allows for more accurate control of the dither stage.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

I claim:

1. A system, comprising:
  a stage, and
  a plurality of PZT bimorph actuators arranged about and connected to the stage, wherein each of the plurality of PZT bimorph actuators comprises a Z-cut groove enabling both in-plane and out-of-plane motion along three translational axes and about three rotational axes, and
  wherein the stage has at least six degrees of freedom.

2. The system of claim 1, wherein at least one of the plurality of PZT bimorph actuators comprises a square coil configuration.

3. The system of claim 2, wherein at least one of the plurality of PZT bimorph actuators comprises at least four square coil configurations.

4. The system of claim 1, wherein at least one of the plurality of PZT bimorph actuators comprises a curve meander configuration.

5. The system of claim 1, wherein at least one of the plurality of PZT bimorph actuators comprises a curved spring configuration.

6. The system of claim 1, wherein the plurality of PZT bimorph actuators are spaced apart along a peripheral portion of the stage.

7. The system of claim 6, wherein a spacing between each of the PZT bimorph actuators along the peripheral portion of the stage is equal.

8. The system of claim 1, further comprising a spring disposed between at least one of the plurality of PZT bimorph actuators and the stage.

9. The system of claim 8, wherein at least one of the plurality of PZT bimorph actuators comprises a square coil configuration, a curved meander configuration, or a curved spring configuration.

10. The system of claim 1, further comprising a spring disposed between each of the plurality of PZT bimorph actuators and the stage.

11. A net motion sensor, comprising:
  a stage having at least six degrees of freedom;
  a plurality of PZT bimorph actuators arranged about and connected to the stage, wherein each of the plurality of PZT bimorph actuators comprises a Z-cut groove enabling both in-plane and out-of-plane motion along three translational axes and about three rotational axes; and
  a plurality of PZT bimorph sensors, each of the plurality of PZT bimorph sensors being incorporated to a respective one of the plurality of PZT bimorph actuators and coupled to the stage,
  wherein the net motion sensor is sensitive to angular or linear acceleration of the stage and produces a zero output if no angular or linear movement or acceleration is applied to the net motion sensor.

12. A method for determining differential signals and/or net bias changes of an inertial sensor, comprising:
  providing a stage having at least six degrees of freedom,
  providing a plurality of PZT bimorph actuators arranged about and connected to the stage, wherein each of the plurality of PZT bimorph actuators comprises a Z-cut groove enabling both in-plane and out-of-plane motion along three translational axes and about three rotational axes;
  providing at least one inertial sensor on the stage; and
  dithering the stage to produce an output signal from the at least one inertial sensor.

13. The method of claim 12, further comprising:
  disposing the at least one inertial sensor on a top surface of the stage and at least one other inertial sensor on a bottom surface of the stage, wherein the at least one inertial sensor disposed on the top surface has a sensitive axis facing in an opposite direction to a corresponding sensitive axis of the at least one other inertial sensor disposed on the bottom surface.

14. The method of claim 12, further comprising:
  disposing the at least one inertial sensor on a top surface of the stage with a sensitive axis facing in a first direction and at least one other inertial sensor on the top surface of the stage adjacently disposed relative thereto with a sensitive axis facing in a second direction different than the first direction.

15. The method of claim 14, wherein the second direction is opposite the first direction.

16. The method of claim 12, wherein the dithering step further comprises dithering at a constant voltage and then sweeping in frequency to achieve different rates.

17. The method of claim 12, wherein the dithering step further comprises using an external magnetic coil to drive a permanent magnet coupled to the stage.

18. The method of claim 12, wherein the dithering step further comprises using an integrated coil on the stage, configured to be pulled toward a permanent magnet attached to a non-moving structure adjacent the stage.

19. A method for determining a net motion of an inertial sensor, comprising:
- providing a stage having at least six degrees of freedom;
- providing a plurality of PZT bimorph actuators arranged about and connected to the stage, each of the plurality of PZT bimorph actuators comprising a Z-cut groove enabling both in-plane and out-of-plane motion along three translational axes and about three rotational axes,
- providing at least one inertial sensor disposed on the stage;
- providing a plurality of PZT bimorph sensors, each of the plurality of PZT bimorph sensors being incorporated to a respective one of the plurality of PZT bimorph actuators and coupled to the stage; wherein net motion sensor is sensitive to angular or linear acceleration of the stage and produces a zero output if no angular or linear movement or acceleration is applied to the net motion sensor; and
- determining an output signal from the plurality of PZT bimorph sensors.

* * * * *